US008878712B2

(12) United States Patent
Cullinane et al.

(10) Patent No.: US 8,878,712 B2
(45) Date of Patent: Nov. 4, 2014

(54) FLASH ADC SHUFFLING

(71) Applicants: John Cullinane, Kilmallock (IE); Frederick Carnegie Thompson, Foynes (IE)

(72) Inventors: John Cullinane, Kilmallock (IE); Frederick Carnegie Thompson, Foynes (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/829,257

(22) Filed: Mar. 14, 2013

(65) Prior Publication Data
US 2014/0266839 A1    Sep. 18, 2014

(51) Int. Cl.
*H03M 1/36* (2006.01)
*H03M 1/34* (2006.01)

(52) U.S. Cl.
CPC ....................................... *H03M 1/34* (2013.01)
USPC .......................................... 341/159; 341/155

(58) Field of Classification Search
USPC ........................................................ 341/159
See application file for complete search history.

(56) References Cited

U.S. PATENT DOCUMENTS

| 4,994,806 | A  | * | 2/1991 | Yun-Tae ......................... 341/155 |
| 5,194,866 | A  | * | 3/1993 | Imaizumi et al. ............. 341/156 |
| 5,416,484 | A  |   | 5/1995 | Lofstrom |
| 5,731,776 | A  | * | 3/1998 | Kumamoto et al. .......... 341/159 |
| 6,504,499 | B1 | * | 1/2003 | Masenas et al. ............... 341/155 |
| 6,518,898 | B1 |   | 2/2003 | Choksi |
| 7,187,317 | B2 | * | 3/2007 | Oka ............................... 341/156 |
| 7,760,127 | B2 |   | 7/2010 | Sutardja |

* cited by examiner

*Primary Examiner* — Khai M Nguyen
(74) *Attorney, Agent, or Firm* — Kenyon & Kenyon, LLP

(57) ABSTRACT

A flash ADC circuit may include a reference ladder providing reference signals and a plurality of comparators, each providing an output based on a comparison of a pair of input signals to a pair of reference signals. At least one pair of the comparators may receive the same pair of reference signals with a different orientation of the reference signals at each of the comparators. The flash ADC may include a switch network for swapping the pair of reference signals between the pair of comparators.

20 Claims, 4 Drawing Sheets

100

400

FLASH ADC SHUFFLING

BACKGROUND

The subject matter of this application is directed to analog-to-digital (ADC) converters, and more particularly to shuffling inputs of a flash ADC.

Flash ADCs include comparators to compare an analog input signal to a plurality of reference voltages provided by a voltage ladder. The voltage ladder includes resistors connected in series to provide a plurality of reference voltages. Each comparator provides an output based on the comparison of the input signal to the one of the coupled reference voltages from the voltage ladder.

Outputs of the comparators are provided to a digital encoder generating a digital signal representing the analog input signal. In some application, the outputs of the flash ADC are provided to digital-to-analog (DAC) converters for further processing. Due to the mismatch in unit elements of the DACs, dynamic element matching schemes are applied to the outputs of the flash ADC to perform shuffling in the digital domain before the DAC receives the digital signals. However, the digital logic associated with such schemes introduces a delay, as time is needed to propagate the DAC bits through the digital shuffling block. For high-speed applications such delays are unacceptable.

To take account of the mismatch in the DAC unit elements, some methods perform the shuffling on the ADC side. However, these methods use complex switching techniques and/or significant routing circuitry on the inputs to the comparators.

Accordingly, there is a need in the art for shuffling of a flash ADC that is simple and applicable with high-speed operations.

BRIEF DESCRIPTION OF THE DRAWINGS

So that features of the present invention can be understood, a number of drawings are described below. It is to be noted, however, that the drawings illustrate only particular embodiments of the disclosure and are therefore not to be considered limiting of its scope, for the invention may encompass other equally effective embodiments.

DETAILED DESCRIPTION

Embodiments of the present disclosure may provide a flash ADC that is simple and applicable with high-speed operations. The flash ADC circuit may include a reference ladder providing reference signals and a plurality of comparators, each providing an output based on a comparison of a pair of input signals to a pair of reference signals. At least one pair of the comparators may receive the same pair of reference signals with a different orientation of the reference signals at each of the comparators. The flash ADC may include a switch network for swapping the pair of reference signals between the pair of comparators.

Figure 1:
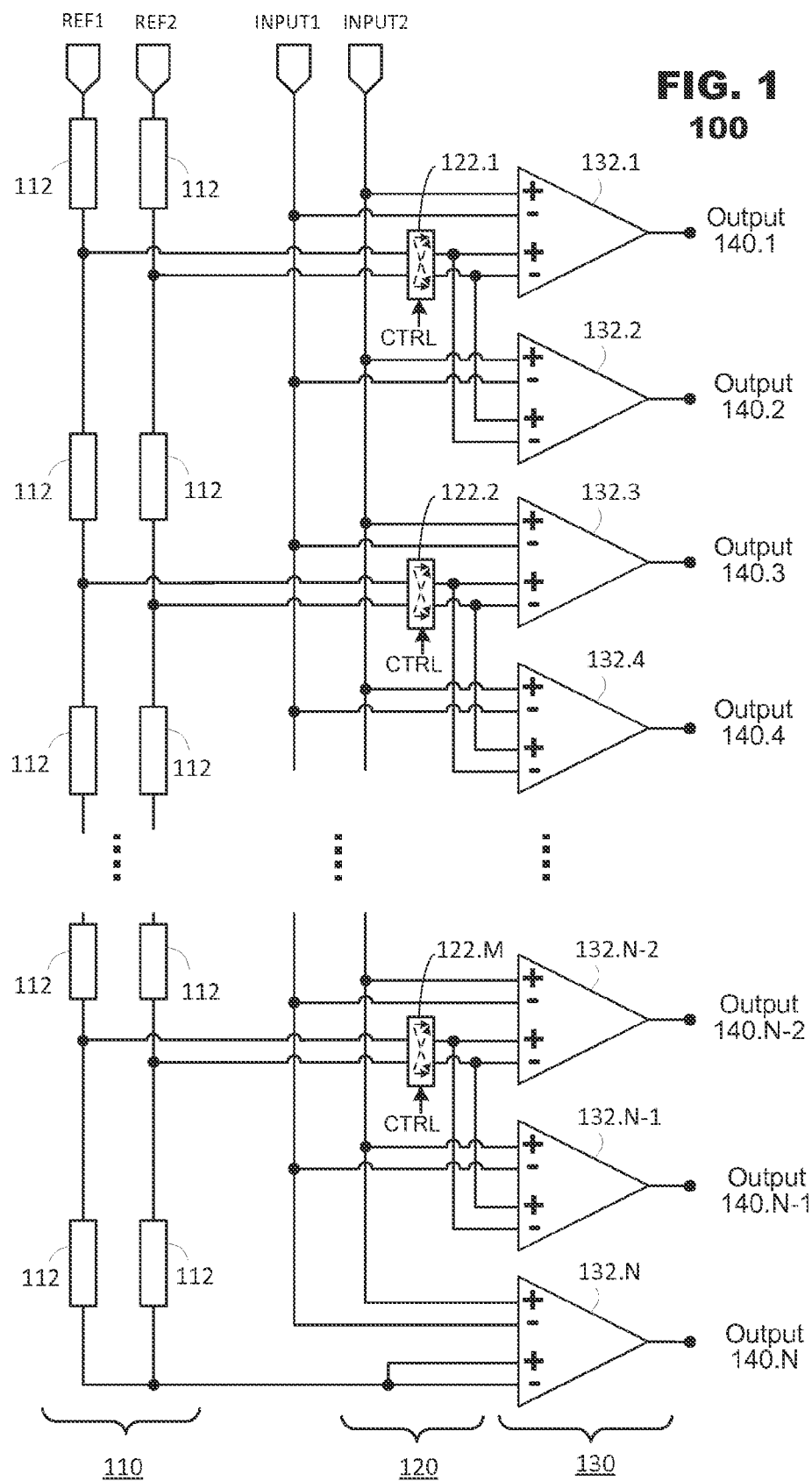
FIG. 1 illustrates a flash ADC according to an embodiment of the present disclosure.

FIG. 1 illustrates a flash ADC 100 according to an embodiment of the present disclosure. The flash ADC 100 may include a voltage ladder 110 coupled to a comparator network 130 via a switching network 120. The comparator network 130 compares input signals INPUT1, INPUT2 to the reference voltages from the voltage ladder 110 and provides outputs 140.1-140.N based on the comparison. The switching network 120 changes the orientation of reference voltages provided to the comparators in the comparator network 130.

The voltage ladder 110 may receive supply voltages REF1, REF2 and provide a plurality of reference voltages having different voltage values. The first and second supply voltages REF1, REF2 may be supplied to a plurality of circuit elements 112 arranged in series to provide the plurality of reference voltages. Circuit elements can be any one or a combination of resistors, capacitors, diodes, diode connected NMOS or PMOS transistors and zener diodes. The first supply voltage REF1 can be a positive supply voltage and the second supply voltage REF2 can be a negative supply voltage, a lower supply voltage or a ground. The second supply voltage REF2 may be a negative value of the first supply voltage REF1.

The comparator network 130 may include a plurality of comparators 132.1-132.N, each receiving reference voltages and input signals INPUT1 and INPUT2. Each of the comparators 132.1-132.N may provide an output 140.1-N based on the comparison of the reference voltages to the input signals INPUT1 and INPUT2. Comparators 132.1-132.N may be differential comparators receiving a differential reference signal from the voltage ladder 110. The voltage difference between the differential reference signals provides the reference level against which a differential input signal from INPUT1 and INPUT2 are compared.

As shown in FIG. 1, input signals INPUT1 and INPUT2 are provided to each of the comparators 132.1-132.N. In addition, each comparator 132.1-132.N−1 receives two reference voltages from the voltage ladders 110. The comparators 132.1-132.N−1 are provided in pairs such that one comparator (e.g., comparator 132.1) receives two reference voltages and the other comparator (e.g., comparator 132.2) receives the same two reference voltages with a reversed polarity (i.e., different orientation). Comparator 132.N may receive a single voltage at both reference inputs of the comparator 132.N to provide a comparison to a zero voltage level.

The switching network 120 couples one or more reference voltages and the input signals INPUT1 and INPUT2 to each of the comparators in the comparator network 130. The switching network may include switches 122.1-122.M to change the orientation of the reference voltages provided to one or more comparators in the comparator network 140. Because a pair of comparators (e.g., comparators 132.1 and 132.2 or comparators 132.3 and 132.4) uses the same two reference voltages but with different orientation (i.e., having an opposite polarity) for each comparator, switches 122.1-122.M can simultaneously change the orientation of the reference voltage provided to each pair of comparators. Switching the orientation for a pair of comparators simultaneously allows for different comparators to perform the comparison at a particular reference level, while still performing the comparison at all of the reference levels.

Switches 122.1-122.M may change the orientation of the two input signals in response to a control signal CTRL. The control signal CTRL may activate the one or more of the switches 122.1-122.M to change the origination at the sampling rate. The control signal CTRL may be a clock signal that changes the origination of the two input signals in each phase of the clock signal. Different control signals may be provided to each of the switches 122.1-122.M. The switches 122.1-122.M may be fully randomly or pseudo randomly controlled to perform random swapping of the reference voltages. Random swapping of each pair of comparators will break up spurs related to the swapping operation.

The switches 122.1-122.M may be controlled to perform frequency shaping to move the offsets to a part of the frequency spectrum that can be filtered out down the signal chain. Other switching schemes could be used to control the switches 122.1-122.M to include data-dependent shuffling to shape the non-idealities.

Where the outputs 140.1-140.N are used to drive a thermometer DAC, the shuffling of the reference voltages by changing the orientation of the reference voltages in a pair of comparators allows the elements of the thermometer DAC to be shuffled. Thus, the shuffling of the reference voltages by the switches 122.1-122.M enables the mismatch in both the comparator 132.1-132.N (e.g., comparator offsets) and the elements of the thermometer DAC to be broken up. Such shuffling provides benefits in both DC and AC performance metrics.

Figure 2:
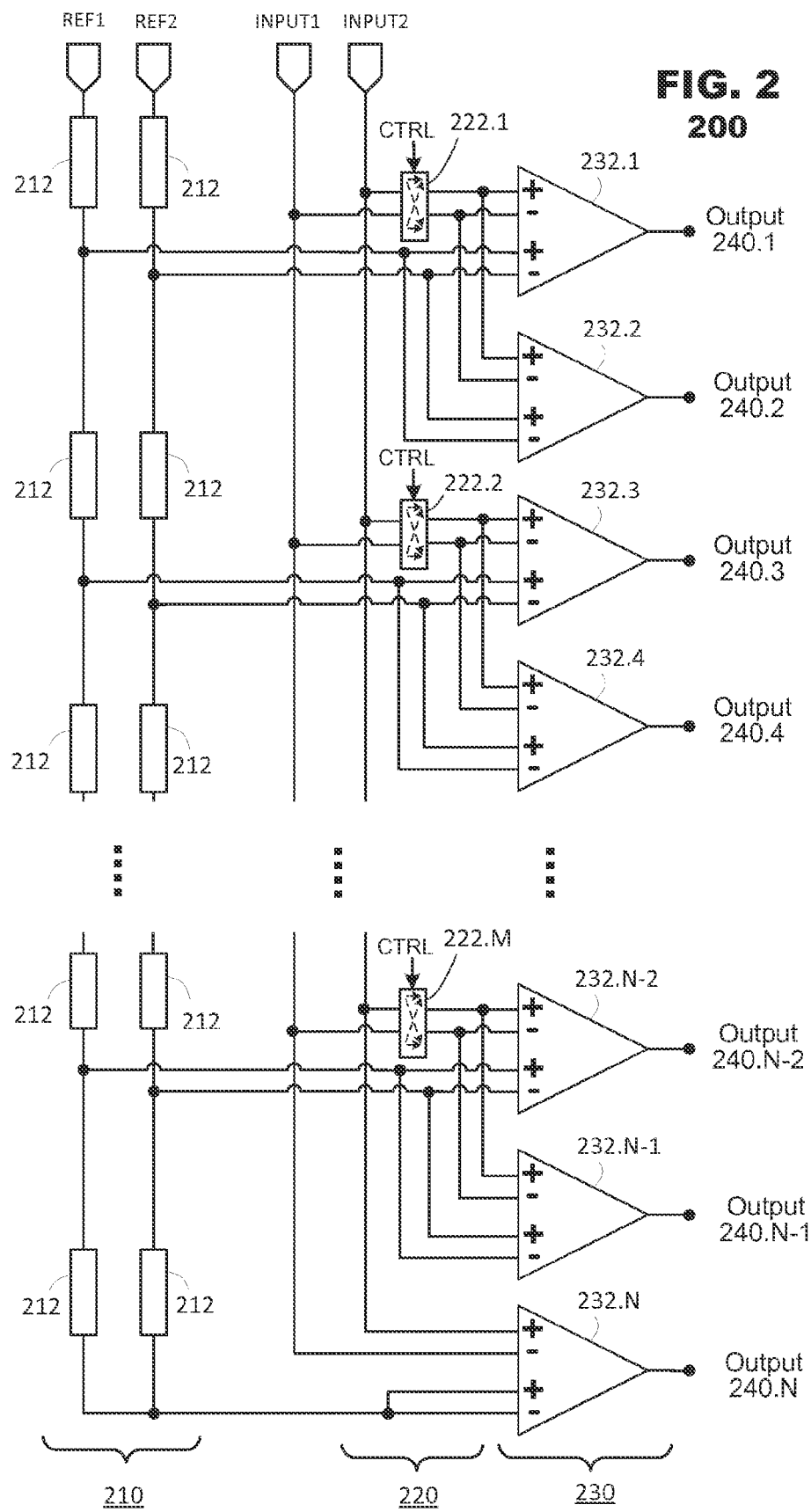
FIG. 2 illustrates a flash ADC according to another embodiment of the present disclosure.

FIG. 2 illustrates a flash ADC 200 according to another embodiment of the present disclosure. The flash ADC 200 may include a voltage ladder 210 coupled to a comparator network 230 via a switching network 220. The comparator network 230 compares input signals INPUT1, INPUT2 to the reference voltages from the voltage ladder 210 and provides outputs based on the comparison. The switching network 220 changes the orientation of input signals INPUT1, INPUT2 provided to the comparators in the comparator network 230.

While in FIG. 1 the reference voltages provided to the pair of comparators are swapped, in FIG. 1 the input signals applied to a pair of comparators are swapped by switches 222.1-222.M. In one embodiment, both switches 122.1-122.M shown in FIG. 1 and switches 222.1-222.M may be included in the same flash ADC. In such an embodiment, only one of the switches 122.1 or 222.1 would be operated in each pair of comparators.

Discussion of circuit components in FIG. 1 may correspond to similar circuit components in FIG. 2.

In the embodiments shown in FIGS. 1 and 2, a switch circuit 122.1-122.M or 222.1-222.M is provided for each pair of comparators. In other embodiments, a separate switch may be provided for each comparator and the pair of switches associated with the pair of comparators may be operated simultaneously.

In discussing the embodiments shown in FIGS. 1 and 2, the voltage ladder 110, 210 provides a plurality of reference voltages. In other embodiments, the voltage ladder 110, 210 may provide a plurality of reference currents to the plurality of comparators.

Figure 3:
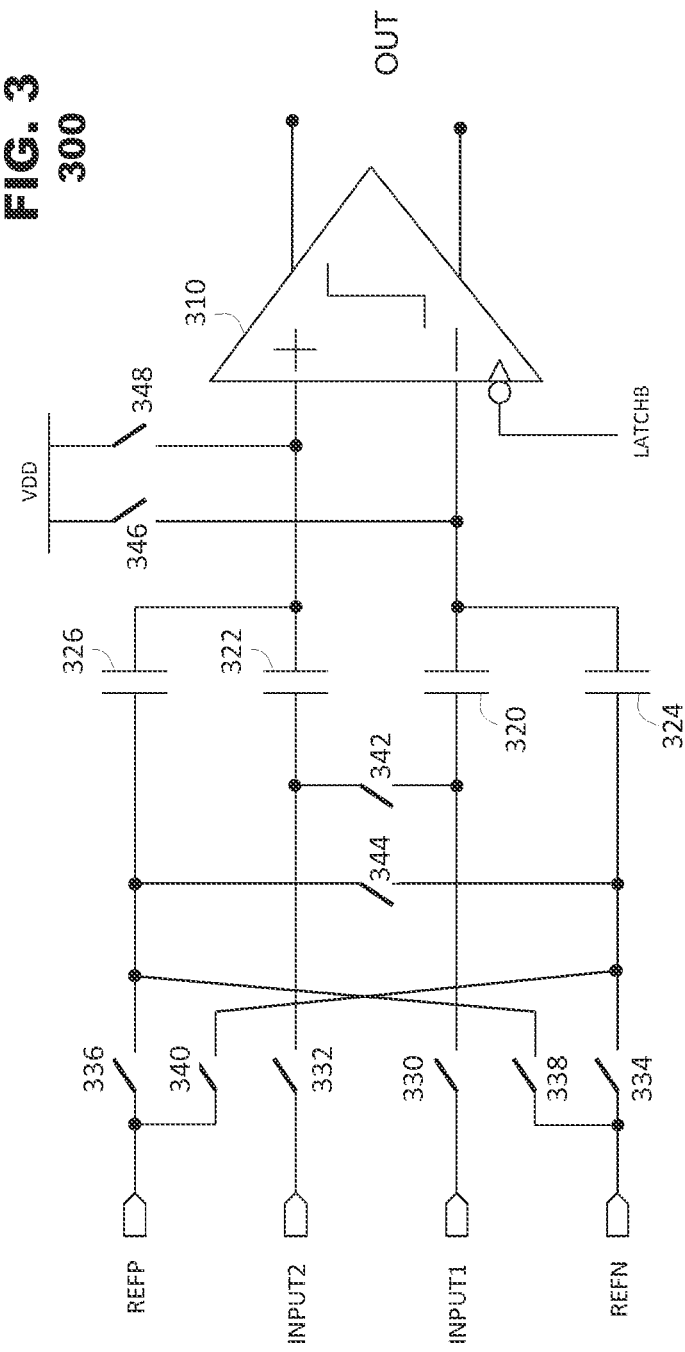
FIG. 3 illustrates a comparator circuit for providing inputs to a comparator according to an embodiment of the present disclosure.

FIG. 3 illustrates a comparator circuit 300 for providing inputs to a comparator according to an embodiment of the present disclosure. The comparator circuit 300 may include comparator 310, input sampling capacitors 320, 322, reference sampling capacitors 324, 326, and a plurality of switches 330-348 coupling a supply voltage VDD, inputs signals INPUT1, INPUT2, and reference signals REFP and REFN to the inputs of the comparator 310.

Switches 330, 332 may couple the input signals INPUT1 and INPUT2 to the negative and positive inputs of the comparator 310 via input sampling capacitors 320, 322, respectively. Switches 334, 336 may couple the reference signals REFP and REFN to the negative and positive inputs of the comparator 310 via reference sampling capacitors 324, 326, respectively. Similarly, switches 338, 340 may couple the reference signals REFP and REFN to the negative and positive inputs of the comparator 310 via reference sampling capacitors 326, 324, respectively.

Switch 342 may couple the input sampling capacitors 320, 322 and switch 344 may couple the reference sampling capacitors 324, 326. Switch 346 may couple the supply voltage VDD to a node connecting the negative input of capacitor 310, the input sampling capacitor 320 and the reference sampling capacitor 324. Switch 348 may couple the supply voltage VDD to a node connecting the positive input of capacitor 310, the input sampling capacitor 322 and the reference sampling capacitor 326.

In operation, the comparator circuit 300 may include four phases of operation to provide comparison of the input signals INPUT1 and INPUT2 to the reference signals REFP and REFN. In the first phase, switches 330, 332, 334, 336, 346, 348 are closed, while the rest of the switches are open, to settle the values of the input signals INPUT1, INPUT2 and the reference signals REFP, REFN onto the sampling capacitors 320, 322, 324, 326, respectively. In the second phase, switches 330, 332, 334, 336, 346, 348 are open to sample the input signals INPUT1, INPUT2 and the reference signals REFP, REFN onto the sampling capacitors 320, 322, 324, 326, respectively.

In the third phase, switch 342 is closed to short the input sampling capacitors 320, 322 and switch 344 is closed to short the reference sampling capacitors 324, 326. Shorting sampling capacitors 320, 322, 324, 326 develops a latch input voltage at the positive and negative inputs of the comparator 310. In the first, second and third phase, a high signal is provided to the latch input LATCHB of comparator 310 to reset the comparator 310.

In the fourth phase, while switches 342 and 344 are still closed and the remaining switches are open, the latch input LATCHB of the comparator 310 is provided a low signal for the comparator 310 to generate an output signal OUT based on the comparison of the signals supplied to the positive and negative input of the comparator 310. The output signal OUT of the comparator 310 may be provided to a DAC.

As discussed above with reference to FIG. 1, the reference signals REFP, REFN that are provided to the reference sampling capacitors 324, 326 may be swapped (e.g., to change the polarity of the reference signals at the inputs of the comparator). To swap the reference signals REFP, REFN, in the next cycle, as part of the first phase, switches 338 and 340 may be closed instead of switches 334, 336. In the first phase switches 338 and 340 are closed together with switches 330, 332, 346 and 348.

Similarly, additional switches may be added to the comparator circuit 300 to swap the input signals INPUT1, INPUT2 which are provided to the input sampling capacitors 320, 322.

Figure 4:
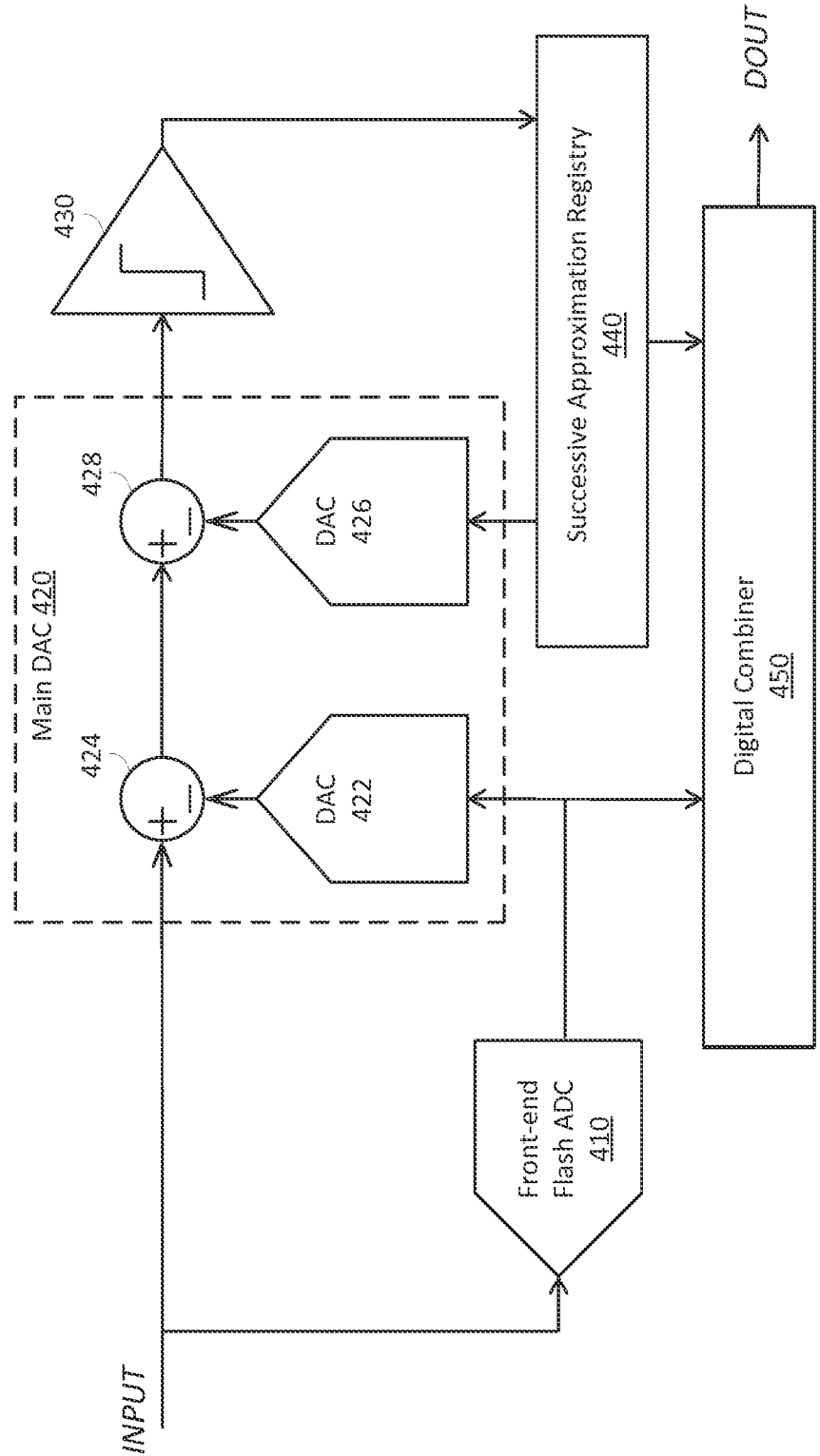
FIG. 4 illustrates an ADC architecture that may include the flash ADC according to an embodiment of the present disclosure.

FIG. 4 illustrates an ADC architecture 400 that may include the flash ADC 410 according to an embodiment of the present disclosure. The ADC architecture 400 may include a flash ADC 410, main DAC 420, comparator 430, successive approximation registry (SAR) 440 and a digital combiner 450. The flash ADC 410 may perform a conversion of the input signal to generate the most significant bits of the digital output signal DOUT. The loop formed by the main ADC 420, comparator 430 and SAR 440 may perform a conversion of the input signal to generate the least significant bits of the digital output signal DOUT.

The analog input signal INPUT may be provided to the front-end flash ADC 410 to convert the input signal INPUT into a digital value. The flash ADC 410 may determine a predetermined number of the most significant bits and provide them to the main DAC 420 and the digital combiner 450.

The flash ADC 410 may include the architecture according to one of the embodiments of the flash ADCs shown in FIGS. 1 and 2.

The main DAC 420 may convert digital values approximating the input signal INPUT into analog values. The main DAC 420 may include a first DAC 422 receiving the most significant bits from the flash ADC 410 and a second DAC 426 receiving least significant bits from the SAR 440. The first DAC 422 converts the most significant bits provided by the flash ADC 410 into an analog value that is subtracted from the input signal INPUT via adder 424. The second DAC 426 converts the least significant bits provided by the SAR 440 into an analog value that is subtracted from the input signal INPUT via adder 428.

Comparator 430 compares the output of the main DAC 420 to a reference signal and provides a comparison result to the SAR 440. Based on the results of the comparison by comparator 430, the SAR 440 provides a digital value of the least significant bits to the second DAC 426 and to the digital combiner 450. The SAR 440 may also provide a control signal to the second DAC 426 to control the conversion of the least significant bits into the analog signal by the second DAC 426. The SAR 440 may perform redundant conversions to improve the accuracy of the least significant bits.

The digital combiner 450 combines the most significant bits provided by the flash ADC 410 and the least significant bits provided by the SAR 440 to produce a digital output DOUT representing the analog input signal INPUT. The digital combiner 450 may process any overlap between the least significant bits and the most significant bits.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A flash analog-to-digital circuit, comprising:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network for swapping the pair of reference signals between the pair of comparators.

2. The circuit of claim 1, wherein the plurality of comparators include a plurality of pairs of comparators, each pair of comparators receiving a different pair of reference signals from the reference ladder.

3. The circuit of claim 2, wherein the switch network swaps the pair of reference signals between the pair of comparators in each pair of comparators.

4. The circuit of claim 2, wherein the switch network randomly selects in which pairs of comparators to perform the swapping of the pair of reference signals between the pair of comparators.

5. The circuit of claim 2, wherein the switch network selects a different set of pairs of comparators in which to perform the swapping of the pair of reference signals, each time the input signals are sampled by the comparators.

6. The circuit of claim 2, wherein:
the outputs of the comparators are coupled to corresponding unit elements of a digital-to-analog converter; and
the switch network performs shaping of mismatch between the unit elements by selecting which pairs of comparators to perform the swapping.

7. The circuit of claim 1, wherein for each comparator the switch network comprises:
a pair of input sampling capacitors;
a pair of reference sampling capacitors;
a first pair of switches coupling the pair of input signals to the respective sampling capacitor;
a second pair of switches coupling the pair of reference signals to the respective reference sampling capacitors with a first orientation of the pair of reference signals; and
a third pair of switches coupling the pair of reference signals to the respective reference sampling capacitors with a second orientation of the pair of reference signals that is opposite to the first orientation.

8. The circuit of claim 7, wherein the first pair of switches is activated to settle the input signals onto the respective input sampling capacitors and one of the first and second pairs of switches is activated to settle the pair of reference signals charges onto the respective reference sampling capacitor.

9. The circuit of claim 1, wherein the reference ladder is a voltage ladder and the reference signals are reference voltages.

10. A flash analog-to-digital circuit, comprising:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network selectively changing an orientation of the pair of input signals that are provided to the pair of comparators.

11. The circuit of claim 10, wherein the plurality of comparators include a plurality of pairs of comparators, each pair of comparators receiving a different pair of reference signals from the reference ladder.

12. The circuit of claim 11, wherein the switch network changes the orientation of the pair of input signals in each pair of comparators.

13. A flash analog-to-digital circuit, comprising:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network changing an orientation of the pair of input signals that are provided to the pair of comparators,
wherein the plurality of comparators include a plurality of pairs of comparators, each pair of comparators receiving a different pair of reference signals from the reference ladder,
wherein the switch network randomly selects in which pairs of comparators to change the orientation of the pair of input signals.

14. A flash analog-to-digital circuit, comprising:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network changing an orientation of the pair of input signals that are provided to the pair of comparators,
wherein the plurality of comparators include a plurality of pairs of comparators, each pair of comparators receiving a different pair of reference signals from the reference ladder,
wherein the switch network selects a different set of pair of comparators in which to change the orientation of the pair of input signals, the selection being made each time the input signals are sampled by the comparators.

15. The circuit of claim 14, wherein the switch network swaps the pair of reference signals between the pair of comparators in at least one pair of comparators.

16. A flash analog-to-digital circuit, comprising:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network changing an orientation of the pair of input signals that are provided to the pair of comparators,
wherein for each comparator the switch network comprises:
a pair of input sampling capacitors;
a pair of reference sampling capacitors;
a first pair of switches coupling the pair of input signals to the respective sampling capacitor with a first orientation of the pair of input signals;
a second pair of switches coupling the pair of inputs to the respective sampling capacitor with a second orientation of the input signals that is opposite to the first orientation; and
a third pair of switches coupling the pair of reference signals to the respective reference sampling capacitors.

17. The circuit of claim 16, wherein one of the first and second pairs of switches are activated to settle the input signals onto the respective input sampling capacitors and the third pair of switches is activated to settle the pair of reference signals onto the respective reference sampling capacitor.

18. An analog-to-digital converter comprising:
a flash analog-to-digital (ADC) circuit for converting input signals to provide a number of most significant bits of a digital signal representing the input signals;
a successive approximation register (SAR) ADC circuit coupled to the flash ADC circuit, the SAR ADC circuit receiving the digital signal generated by the flash ADC and the input signals to provide a number of least significant bits of the digital signal representing the input signals;
a combiner circuit coupled to the flash ADC circuit and the SAC ADC circuit, the combiner circuit generating the digital signal representing the input signals by combining the most significant bits and the least significant bits, wherein
the flash analog-to-digital circuit includes:
a reference ladder providing reference signals;
a plurality of comparators, each providing an output based on a comparison of a pair of input signals to a pair of reference signals, at least one pair of the comparators receiving the same pair of reference signals with a different orientation of the reference signals at each of the comparators; and
a switch network swapping the pair of reference signals between the pair of comparators or selectively changing an orientation of the pair of input signals that are provided to the pair of comparators.

19. An analog-to-digital converter comprising:
a flash analog-to-digital (ADC) circuit for converting input signals to provide a number of most significant bits of a digital signal representing the input signals;
a successive approximation register (SAR) ADC circuit coupled to the flash ADC circuit, the SAR ADC circuit receiving the digital signal generated by the flash ADC and the input signals to provide a number of least significant bits of the digital signal representing the input signals;

a combiner circuit coupled to the flash ADC circuit and the SAC ADC circuit, the combiner circuit generating the digital signal representing the input signals by combining the most significant bits and the least significant bits, wherein the flash analog-to-digital circuit includes:

a reference ladder providing reference signals;

a plurality of comparators, each providing an output based on a comparison of a pair of input signals to a pair of reference signals, at least one pair of the comparators receiving the same pair of reference signals with a different orientation of the reference signals at each of the comparators; and a switch network swapping the pair of reference signals between the pair of comparators or changing an orientation of the pair of input signals that are provided to the pair of comparators, wherein:

the plurality of comparators include a plurality of pairs of comparators, each pair of comparators receiving a different pair of reference signals from the reference ladder;

the outputs of the comparators are coupled to corresponding unit elements of a digital-to-analog converter; and the switch network performs noise shaping of mismatch between the unit elements by selecting which pairs of comparators to perform the swapping.

20. An analog-to-digital converter comprising:

a flash analog-to-digital (ADC) circuit for converting input signals to provide a number of most significant bits of a digital signal representing the input signals, a successive approximation register (SAR) ADC circuit coupled to the flash ADC circuit, the SAR ADC circuit receiving the digital signal generated by the flash ADC and the input signals to provide a number of least significant bits of the digital signal representing the input signals;

a combiner circuit coupled to the flash ADC circuit and the SAC ADC circuit, the combiner circuit generating the digital signal representing the input signals by combining the most significant bits and the least significant bits, wherein the flash analog-to-digital circuit includes:

a reference ladder providing reference signals;

a plurality of comparators, each providing an output based on a comparison of a pair of input signals to a pair of reference signals, at least one pair of the comparators receiving the same pair of reference signals with a different orientation of the reference signals at each of the comparators; and a switch network swapping the pair of reference signals between the pair of comparators or changing an orientation of the pair of input signals that are provided to the pair of comparators, wherein:

the plurality of comparators include a plurality of pairs of comparators, each pair of comparators receiving a different pair of reference signals from the reference ladder; and the switch network randomly selects in which pairs of comparators to perform swapping of the pair of reference signals between the pair of comparators.

\* \* \* \* \*